(12) United States Patent  (10) Patent No.: US 7,428,180 B2
Kim  (45) Date of Patent: Sep. 23, 2008

(54) SEMICONDUCTOR MEMORY DEVICES AND METHODS OF TESTING FOR FAILED BITS OF SEMICONDUCTOR MEMORY DEVICES

(75) Inventor: Hyung-Min Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 11/526,321

(22) Filed: Sep. 25, 2006

(65) Prior Publication Data

US 2007/0171739 A1   Jul. 26, 2007

(30) Foreign Application Priority Data

Jan. 25, 2006   (KR) .................... 10-2006-0007903

(51) Int. Cl.
*G11C 7/00* (2006.01)

(52) U.S. Cl. ............. 365/201; 365/189.05; 365/189.07; 365/236

(58) Field of Classification Search ................. 365/201, 365/189.05, 189.07, 236, 185.22
See application file for complete search history.

(56) References Cited

U.S. PATENT DOCUMENTS 6,046,939 A * 4/2000 Noda et al. ............ 365/185.09
6,625,061 B2 9/2003 Higuchi .................. 365/185.09
6,972,993 B2 * 12/2005 Conley et al. .......... 365/185.04
2004/0255224 A1 12/2004 Yabe .......................... 714/763

FOREIGN PATENT DOCUMENTS

| JP | 2002-133892 | 5/2002 |
|---|---|---|
| JP | 2004-086996 | 3/2004 |
| JP | 2005-004876 | 1/2005 |
| KR | 1999-0035741 A | 9/1999 |
| KR | 1020010046174 A | 6/2001 |
| KR | 1020010100270 A | 11/2001 |
| KR | 1020020032340 A | 5/2002 |

* cited by examiner

*Primary Examiner*—Son Dinh
(74) *Attorney, Agent, or Firm*—Myers Bigel Sibley & Sajovec, PA

(57) ABSTRACT

A semiconductor memory device includes a flash memory, a buffer memory configured to receive expected data for testing for failed bits in the flash memory, and a failed bit control unit configured to receive the expected data from the buffer memory, to receive read data from the flash memory, and to calculate a failed bit number and a failed bit position from the expected data and the read data.

20 Claims, 4 Drawing Sheets

SEMICONDUCTOR MEMORY DEVICES AND METHODS OF TESTING FOR FAILED BITS OF SEMICONDUCTOR MEMORY DEVICES

CROSS-REFERENCE TO RELATED APPLICATION

This U.S. non-provisional patent application claims priority under 35 U.S.C § 119 to Korean Patent Application No. 2006-07903 filed on Jan. 25, 2006, the disclosure of which is hereby incorporated by reference.

FIELD OF THE INVENTION

The present invention relates to semiconductor devices and, more particularly, to semiconductor memory devices and methods of testing semiconductor memory devices.

BACKGROUND

Semiconductor memory devices can store data and output the stored data on command. Semiconductor memory devices may be roughly categorized into random access memory (RAM) and read only memory (ROM) devices. A RAM device is typically a volatile memory device that loses its stored data at power-off, although some types of RAM devices are non-volatile. Examples of RAM devices include dynamic RAM, static RAM, and the like. The ROM device is a non-volatile memory device that can retain its stored data even at power-off. Examples of ROM devices include programmable ROM (PROM), erasable PROM (EPROM), electrically erasable PROM (EEPROM), flash memory, and the like. Flash memories can be further classified into NAND-type flash memory and NOR-type flash memory depending on the kinds of logic gates used to implement the memory.

In general, a NAND flash memory may include a cell array, which includes a plurality of memory blocks. Each of the memory blocks may include a plurality of pages. A memory block is typically used as the basic unit for an erase operation, and a page is typically used as the basic unit for a read/write operation.

NAND flash memory devices have been successfully utilized in mobile communication terminals, portable media players, digital cameras, portable storage devices, and the like. In order to use a NAND flash memory device as a storage medium, it may be desirable to secure the integrity of data stored in the NAND flash memory device. However, a NAND flash memory can experience bit failures due to its physical characteristics. Thus, some NAND flash memory devices are configured to be able to detect and/or correct bits that have failed (i.e., "failed bits"). In order to detect/correct failed bits, an error correction code (ECC) circuit may be provided in the NAND flash memory device.

An ECC algorithm may be loaded onto the ECC circuit of the NAND flash memory. This may enable the NAND flash memory device to correct failed bits that may be generated during a read/write operation. Accordingly, it is possible to improve the reliability of a NAND flash memory through the use of error detection/correction circuitry.

In general, a number of packaged memory devices may be tested simultaneously to reduce the time required for testing. Since a test apparatus configured to simultaneously test packaged memory devices may have an error capture RAM that has a limited memory capacity, a compressed and/or summarized test result may be stored in the error capture RAM. According to this test scheme, although a memory block of a packaged memory device may have only one failed bit, the memory block will be considered to be a bad block. In this case, it may not be possible to detect the number of failed bits (i.e. a "failed bit number") of a memory block that has been determined to be a bad block.

A software technique for individually counting failed bits at a test stage may be used to determine the number of failed bits. For example, it is possible to precisely measure a failed bit number for each memory device by storing test results corresponding to all memory cells in an error capture RAM. However, since the storage capacity of the error capture RAM may be limited, the number of memory devices to be tested at the same time may also be limited. This means that the time required to perform the test may be increased.

In methods of counting failed bits in a conventional NAND flash memory, a failed bit number can be detected by inputting expected data through input/output terminals and comparing the expected data with data read from a page of the flash memory. Such a method of generating a failed bit count is disclosed in U.S. patent publication No. 2002-0069381.

In a conventional method of counting failed bits, it may be possible to detect both the existence of a failed bit and the number of failed bits. However, it may not be possible to detect the position of the failed bits (i.e. a "failed bit position") in the memory. In order to correct failed bits, the position of the failed bits must be determined by a tester. Further, since the sample data from a tester is input in predetermined units (e.g., byte or word units), a long time may be required to test failed bits.

SUMMARY

Some embodiments of the present invention provide a semiconductor memory device including a flash memory, a buffer memory configured to receive expected data used to test for failed bits in the flash memory, and a failed bit control unit configured to receive the expected data from the buffer memory, configured to receive read data from the flash memory, and configured to calculate a failed bit number and a failed bit position from the expected data and the read data.

The flash memory may include a NAND flash memory having a plurality of pages. The expected data may correspond to a page of the flash memory, and the buffer memory may be further configured to receive the expected data in a single programming operation. The buffer memory may include a random access memory (RAM).

The failed bit control unit may include a failed bit count unit configured to calculate the failed bit number in response to the expected data and the read data, and a failed bit position unit configured to calculate the failed bit position in response to the expected data and the read data.

The failed bit count unit may include a data comparator configured to compare the expected data with the read data, and a failed bit counter configured to calculate the failed bit number from a comparison result of the data comparator.

The failed bit position unit may include an expected data parity generator configured to generate an expected data parity value from the expected data, a read data parity generator configured to generate a read data parity value from the read data, and a failed bit position generator configured to calculate the failed bit position from the expected data parity value and the read data parity value.

The semiconductor memory device may further include a failed bit register configured to store the failed bit number and the failed bit position.

Some embodiments of the present invention provide a semiconductor memory device including a flash memory having a plurality of pages, a buffer memory configured to receive expected data from a tester so as to test for failed bits in a page of the flash memory, and a control unit configured to control a test operation of the semiconductor memory device in response to a test command from the tester. The device further includes a failed bit control unit configured to operate responsive to a test enable signal from the control unit. The failed bit control unit is configured to receive the expected data from the buffer memory, configured to receive read data from the flash memory, and configured to calculate a failed bit number and a failed bit position from the expected data and the read data.

Still further embodiments of the present invention methods of testing for failed bits in a semiconductor memory device including a flash memory and a buffer memory. The methods include loading expected data into the buffer memory, programming the expected data loaded on the buffer memory into the flash memory, reading read data from the flash memory, and calculating a failed bit number and a failed bit position from the loaded expected data and the read data.

Calculating the failed bit number and the failed bit position may include comparing the read data and the expected data to generate a comparison result, and calculating the failed bit number based on the comparison result.

The methods may further include storing the failed bit number in a register, and providing the tester with the failed bit number in response to a request signal from the tester.

Calculating the failed bit position may include generating a read data parity value from the read data and an expected data parity value from the expected data, respectively, and calculating the failed bit position from the read data parity value and the expected data parity value.

The methods may further include storing the failed bit position in a register, and providing the tester with the failed bit number in response to a request signal from the tester.

BRIEF DESCRIPTION OF THE DRAWINGS.

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof. As used herein, the term "signal" may take the form of a continuous waveform and/or discrete value(s), such as digital value(s) in a memory or register.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present invention are described below with reference to block diagrams, including operational flow charts, of semiconductor devices and associated methods according to various embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Figure 1:
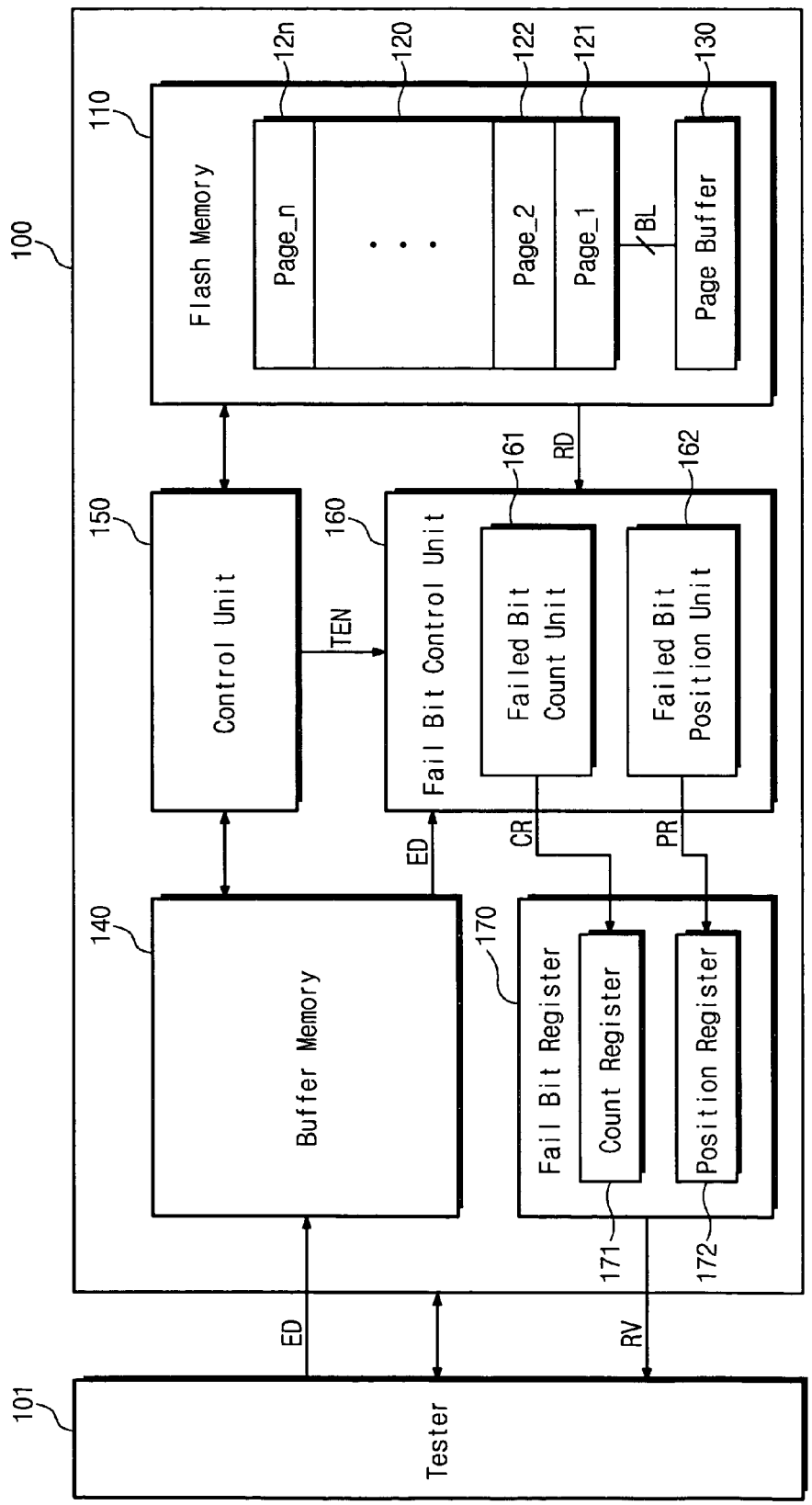
FIG. 1 is a block diagram showing a semiconductor memory device according to some embodiments of the present invention.

FIG. 1 is a block diagram showing a semiconductor memory device 100 according to some embodiments of the present invention. A semiconductor memory device 100 receives expected data ED from a tester 101 in a test operation. The semiconductor memory device 100 performs a failed bit test operation and provides the tester 101 with failed bit information based on the result of the test operation. The semiconductor memory device 100 includes a flash memory 110, a buffer memory 140, a control unit 150, a failed bit control unit 160, and a failed bit register 170.

The flash memory 110 includes a cell array 120 and a page buffer 130. The cell array 120 includes a plurality of pages 121 to 12n. Each of the pages may be a basic unit for a read/write operation. That is, the flash memory 110 may perform read/write operations on a page by page basis. The cell array 110 is connected to the page buffer 130 through bit lines BL. The page buffer 130 stores data to be programmed in a page and/or data read out from a page.

The buffer memory 140 receives and stores expected data ED from the tester 101 in a test operation. The buffer memory 140 can be realized with a random access memory such as DRAM, SRAM, and the like. A conventional semiconductor memory device may not include a buffer memory for storing expected data. Accordingly, a conventional semiconductor memory device may be configured to receive expected data from a tester in predetermined units (e.g., byte or word units) in order to perform a failed bit test operation with respect to a page. Thus, a conventional configuration may require an excessive amount of time to perform a failed bit test operation.

A semiconductor memory device 100 according to embodiments of the present invention includes a buffer memory 140 that is configured to store the expected data ED. Afterwards, the buffer memory 140 may act as a tester that is embedded in the semiconductor memory device 100. Accordingly, the semiconductor memory device 100 can perform failed bit test operations in a reduced time compared to conventional semiconductor memory devices.

The control unit 150 is configured to control the overall operation of the semiconductor memory device 100. In a failed bit test operation, the control unit 150 receives a test command from the tester 101. The control unit 150 receives the expected data ED from the buffer memory 140 and programs the expected data ED in a page (e.g., page 121) based on a program algorithm. Meanwhile, the control unit 150 supplies the failed bit control unit 160 with a test enable signal TEN in response to the test command.

The failed bit control unit 160 performs a failed bit test operation in response to the test enable signal TEN. The failed bit control unit 160 receives the expected data ED from the buffer memory 140 and receives the read data RD from the flash memory 110. That is, the read data RD is data read out from a page (e.g., page 121) of the flash memory 110 where the expected data ED is stored.

The failed bit control unit 160 is configured to calculate the number of failed bits (i.e. the failed bit number) and the position of the failed bits (i.e. the failed bit positions) existing in the page 121 of the flash memory 110, based on a comparison of the expected data ED and the read data RD. Referring to FIG. 1, the failed bit control unit 160 includes a failed bit count unit 161 and a failed bit position unit 162. The failed bit count unit 161 is configured to count the number of failed bits and to output a count result CR. The failed bit position unit 162 is configured to calculate the positions of the failed bits and output a position result PR. The failed bit count and position units 161 and 162 are illustrated in more detail in FIGS. 2 and 3.

Figure 2:
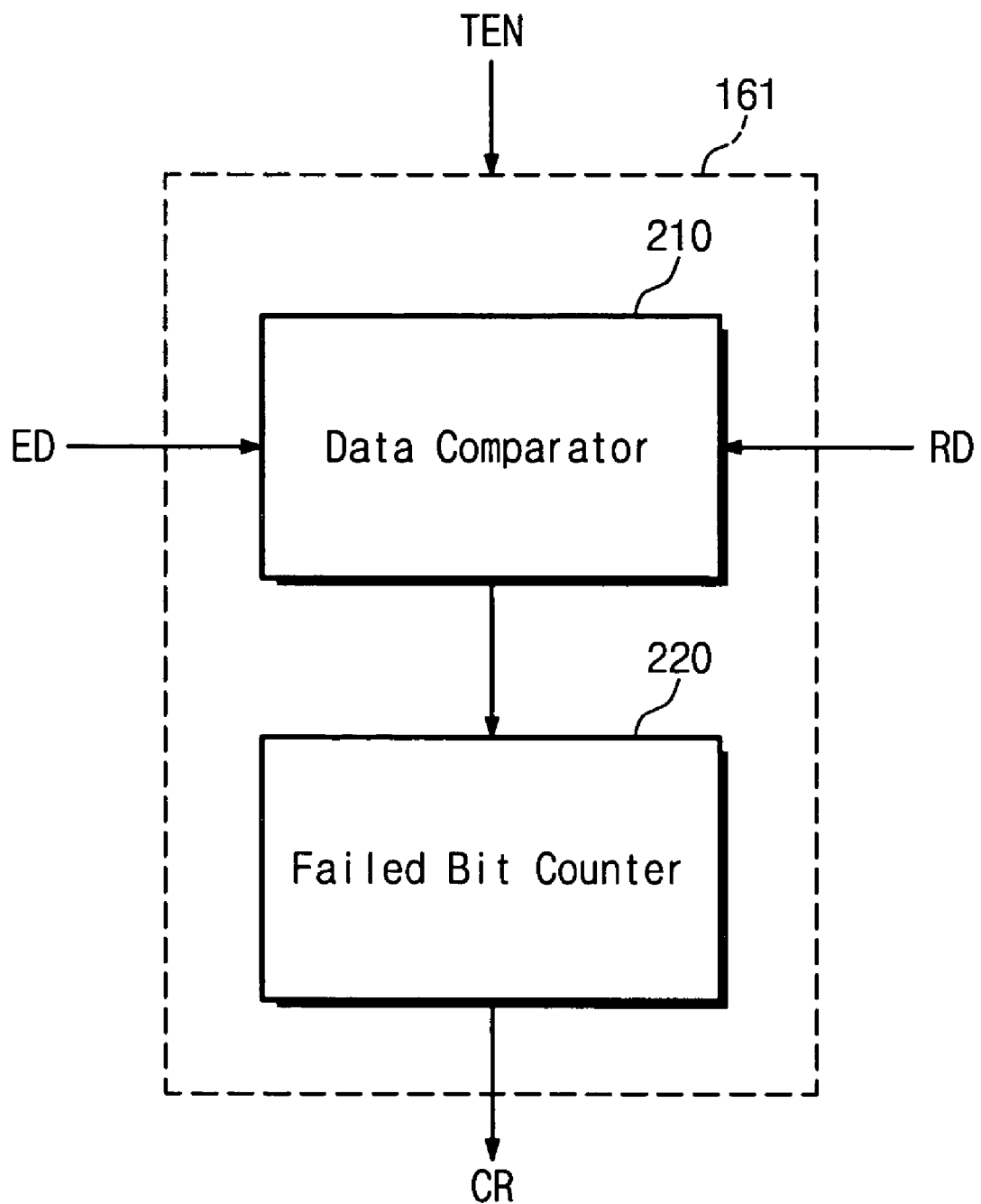
FIG. 2 is a block diagram showing a failed bit count unit as illustrated in FIG. 1 according to some embodiments of the invention.

Referring to FIG. 2, the failed bit count unit 161 operates responsive to the test enable signal TEN. The failed bit count unit 161 receives the expected data ED and the read data RD and responsively calculates a failed bit number. The failed bit count unit 161 includes a data comparator 210 and a failed bit counter 220.

The data comparator 210 receives the expected data ED and the read data RD in predetermined units (e.g., byte or word units) and compares the received data RD to the expected data ED. In the following discussion, a "word" refers to a 16-bit unit of data, and a "byte" refers to an 8-bit unit of data. Assuming that a page consists of 2K-bytes of data, a data comparator 210 configured as shown in FIG. 2 may receive 8-bit data 2K times and/or may receive 16-bit data 1K times in order to compare a page of expected data to a page of read data.

The failed bit counter 220 calculates a failed bit number from an output of the data comparator 210. The failed bit number refers to the number of different bits between the expected data ED and the read data RD. The failed bit counter 220 outputs the count result CR.

Figure 3:
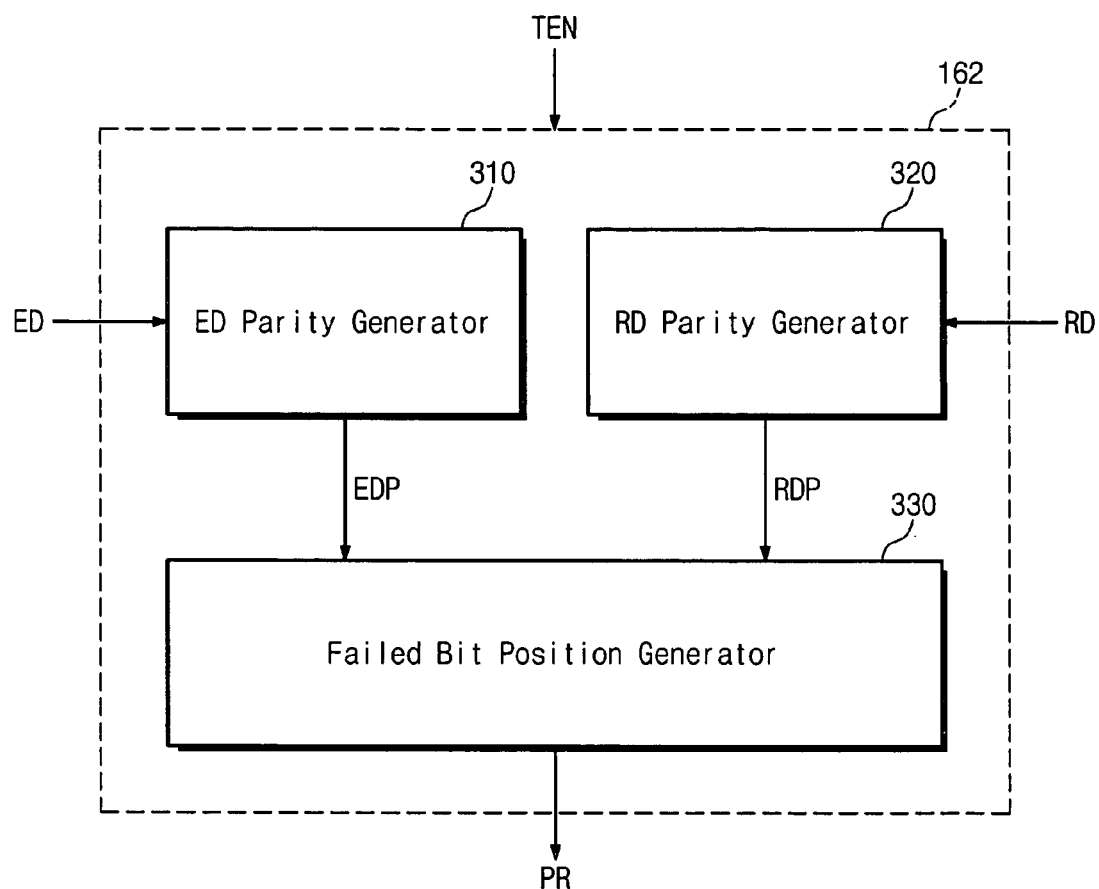
FIG. 3 is a block diagram showing a failed bit position unit as illustrated in FIG. 1 according to some embodiments of the invention.

Referring to FIG. 3, the failed bit position unit 162 operates responsive to the test enable signal TEN. The failed bit position unit 162 receives the expected data ED and the read data RD and calculates a failed bit position. The failed bit position unit 162 includes an expected data parity generator 310, a read data parity generator 320, and a failed bit position generator 330.

The expected data parity generator 310 receives the expected data ED in predetermined units (e.g., word or byte units) and generates an expected data parity value EDP. The read data parity generator 320 receives the read data ED in predetermined units (e.g., word or byte units) and generates a read data parity value RDP. Assuming that a page consists of 2K-bytes of data, each of the expected and read data parity generators 310 and 320 receives 8-bit data 2K times and/or 16-bit data 1K times.

The failed bit position generator 330 receives the expected data parity value EDP and the read data parity value RDP and calculates positions of failed bits existing in the page 121. The failed bit position generator 330 outputs a position result PR of failed bits.

Returning to FIG. 1, the failed bit register 170 is configured to store the count result CR from the failed bit count unit 161 and the position result PR from the failed bit position unit 162. The failed bit register 170 outputs a register value RV in response to a request signal from the tester 101.

The failed bit register 170 includes a count register 171 and a position register 172. The count register 171 receives and stores the count result CR from the failed bit count unit 161, and the position register 172 receives and stores the position result PR from the failed bit position unit 162.

Figure 4:
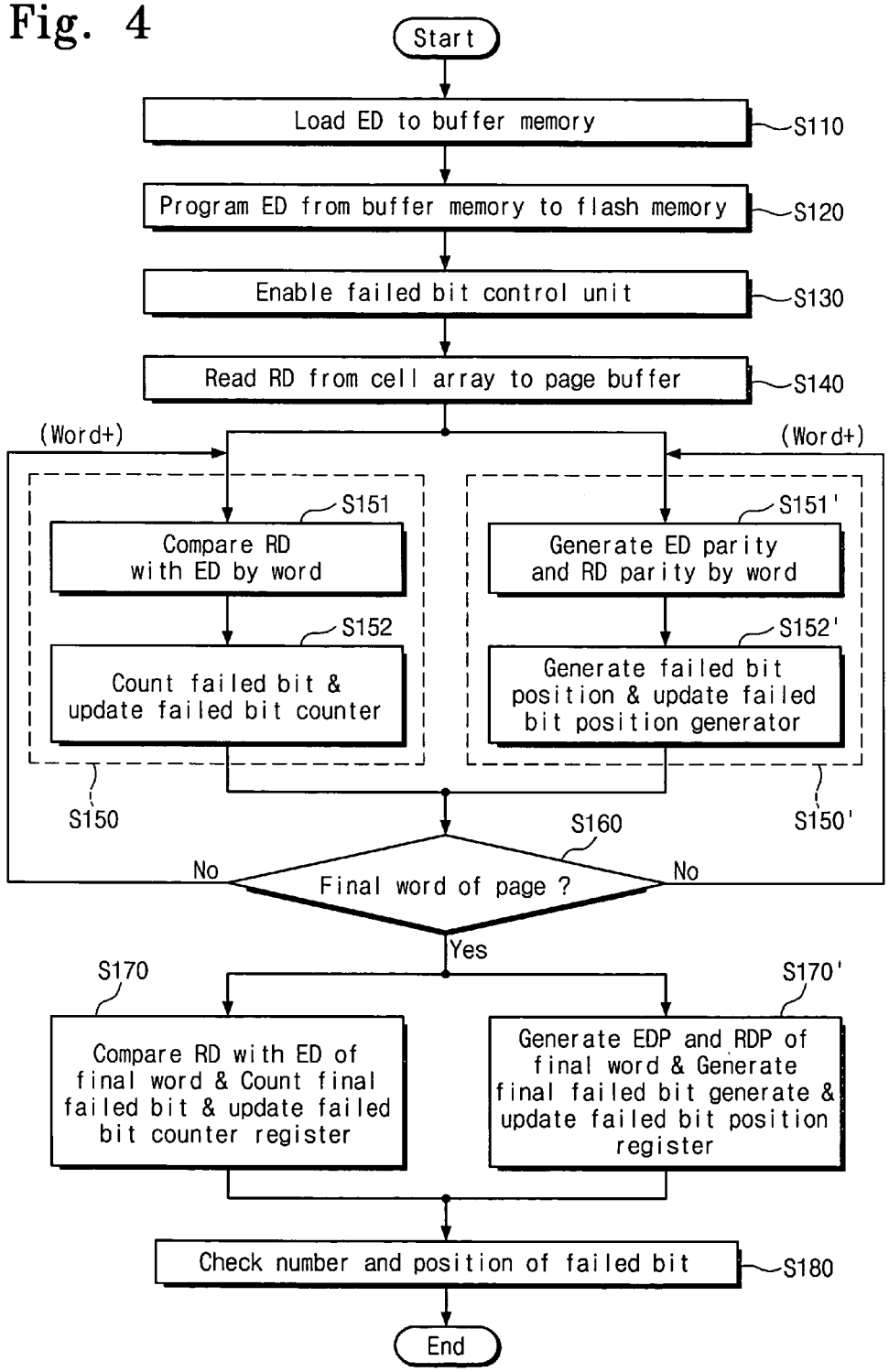
FIG. 4 is a flowchart illustrating bit line test operations according to some embodiments of the invention for a semiconductor memory device as illustrated in FIG. 1.

FIG. 4 is a flowchart illustrating failed bit test operations for a semiconductor memory device according to some embodiments of the present invention. A semiconductor memory device 100 according to some embodiments of the present invention may perform a failed bit test operation in response to a test command.

In step S110, the semiconductor memory device 100 stores the expected data ED in a buffer memory 140. The buffer memory 140 is configured to store a page of data transferred from a tester 101. In step S120, the expected data in the buffer memory 140 is programmed into a flash memory 110 under the control of a control unit 150. In step S130, the control unit 150 enables a failed bit control unit 160. The failed bit control unit 160 operates responsive to a test enable signal TEN. In step S140, a page buffer 130 of the flash memory 100 reads out data from a page 121 of a cell array 120 under the control of the control unit 150.

In steps S150 and S150', the failed bit control unit 160 calculates a failed bit number and a failed bit position from the page 121 of the cell array 120, in predetermined units (e.g., word units). The steps S150 and S150' may be carried out simultaneously or non-simultaneously.

In step S150, the number of failed bits existing at the page 121 is calculated in word units. The step S150 includes steps S151 and S152. In step S151, a failed bit count unit 161 compares the expected data ED and the read data RD in word units. In step S152, the failed bit count unit 161 calculates a failed bit number according to a result of a comparison of the expected data ED and the read data RD in word units. The failed bit count unit 161 updates a failed bit counter 220 in word units.

In step S150', positions of failed bits existing in the page 121 are calculated in word units. The step S150' includes steps S151' and S152'. In step S151', a failed bit position unit 162 generates a read data parity value RDP and an expected data parity value EDP in word units. In step S152', the failed bit position unit 162 calculates a failed bit position from the parity values RDP and EDP in word units. The failed bit position unit 12 updates a failed bit position generator 330 in word units.

In step S160, the failed bit control unit 160 determines whether the received read data word is the last data word of the page 121. If the received read data word is not the last data word of the page 121, the steps S150 and S150' may be repeated until the last data word is received. If the received read data is the last data word of the page 121, the procedure goes to steps S170 and S170'. The steps S170 and S170' may be performed simultaneously or non-simultaneously.

In step S170, the failed bit control unit 160 receives the last data word of the page 121 and calculates a final failed bit number. The operation of the step S170 is similar to that of step S150 with respect to the last data word. The failed bit count unit 161 updates a count register 171 of a failed bit register 170.

In step S170', the failed bit control unit 160 receives the last data word of the page 121 and calculates a final failed bit position. The operation of step S170' is similar to that of step S150' with respect to the last data word. The failed bit position count unit 162 updates a position register 172 of the failed bit register 170.

In step S180, the semiconductor memory device supplies the tester 101 with values (that is, failed bit number and position information) stored in the failed bit register 170 in response to a request signal from the tester 101. By using the above-described operations, the tester 101 may check the failed bit number and position in a page of the flash memory 110.

A semiconductor memory device according to some embodiments of the present invention can reduce testing time since an entire page of expected data may be provided to a buffer memory for testing at a time. A semiconductor memory device according to some embodiments of the present invention can quickly calculate useful information such as failed bit number information and/or failed bit position information through a failed bit control unit and a failed bit register.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor memory device comprising:
   a flash memory;
   a buffer memory configured to receive expected data used to test for failed bits in the flash memory; and
   a failed bit control unit configured to receive the expected data from the buffer memory, configured to receive read data from the flash memory, and configured to calculate a failed bit number and a failed bit position in response to the expected data and the read data.

2. The semiconductor memory device of claim 1, wherein the flash memory comprises a NAND flash memory having a plurality of pages.

3. The semiconductor memory device of claim 2, wherein the expected data corresponds to a page of the flash memory, and wherein the buffer memory is further configured to receive the expected data in a single programming operation.

4. The semiconductor memory device of claim 2, wherein the buffer memory comprises a random access memory (RAM).

5. The semiconductor memory device of claim 1, wherein the failed bit control unit comprises:
   a failed bit count unit configured to calculate the failed bit number in response to the expected data and the read data; and
   a failed bit position unit configured to calculate the failed bit position in response to the expected data and the read data.

6. The semiconductor memory device of claim 5, wherein the failed bit count unit comprises:
   a data comparator configured to compare the expected data with the read data; and
   a failed bit counter configured to calculate the failed bit number from a comparison result of the data comparator.

7. The semiconductor memory device of claim 5, wherein the failed bit position unit comprises:
   an expected data parity generator configured to generate an expected data parity value from the expected data;
   a read data parity generator configured to generate a read data parity value from the read data; and
   a failed bit position generator configured to calculate the failed bit position from the expected data parity value and the read data parity value.

8. The semiconductor memory device of claim 1, further comprising a failed bit register configured to store the failed bit number and the failed bit position.

9. A semiconductor memory device comprising:
   a flash memory having a plurality of pages;
   a buffer memory configured to receive expected data from a tester so as to test for failed bits in a page of the flash memory;
   a control unit configured to control a test operation of the semiconductor memory device in response to a test command from the tester; and
   a failed bit control unit configured to operate responsive to a test enable signal from the control unit,
   wherein the failed bit control unit is configured to receive the expected data from the buffer memory, configured to receive read data from the flash memory, and configured to calculate a failed bit number and a failed bit position from the expected data and the read data.

10. The semiconductor memory device of claim 9, wherein the expected data corresponds to a page of the flash memory, and wherein the buffer memory is configured to receive the expected data in a single programming operation.

11. The semiconductor memory device of claim 9, wherein the buffer memory comprises a random access memory.

12. The semiconductor memory device of claim 9, wherein the failed bit control unit comprises:
   a failed bit count unit configured to calculate the failed bit number from the expected data and the read data; and
   a failed bit position unit configured to calculate the failed bit position from the expected data and the read data.

13. The semiconductor memory device of claim 12, wherein the failed bit count unit comprises:
   a data comparator configured to compare the expected data with the read data; and
   a failed bit counter configured to calculate the failed bit number from a comparison result of the data comparator.

14. The semiconductor memory device of claim 12, wherein the failed bit position unit comprises:
   an expected data parity generator configured to generate an expected data parity value from the expected data;
   a read data parity generator configured to generate a read data parity value from the read data; and
   a failed bit position generator configured to calculate the failed bit position from the expected data parity value and the read data parity value.

15. The semiconductor memory device of claim 9, further comprising a failed bit register configured to store the failed bit number and the failed bit position.

16. A method of testing for failed bits in a semiconductor memory device including a flash memory and a buffer memory, the method comprising:
   loading expected data into the buffer memory;
   programming the expected data into the flash memory;
   reading read data out from the flash memory; and
   calculating a failed bit number and a failed bit position from the expected data and the read data.

17. The method of claim 16, wherein calculating the failed bit number and the failed bit position comprises:
   comparing the read data and the expected data to generate a comparison result; and
   calculating the failed bit number based on the comparison result.

18. The method of claim 17, further comprising:
   storing the failed bit number in a register; and
   providing the tester with the failed bit number in response to a request signal from the tester.

19. The method of claim 16, wherein calculating the failed bit position comprises:
   generating a read data parity value from the read data and an expected data parity value from the expected data, respectively; and
   calculating the failed bit position from the read data parity value and the expected data parity value.

20. The method of claim 19, further comprising:
   storing the failed bit position in a register; and
   providing the tester with the failed bit number in response to a request signal from the tester.

* * * * *